(12) United States Patent
Baba (10) Patent No.: US 8,448,331 B2
(45) Date of Patent: May 28, 2013

(54) COMPONENT MOUNTING APPARATUS

(75) Inventor: Hiroshi Baba, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/159,583

(22) Filed: Jun. 14, 2011

(65) Prior Publication Data

US 2012/0005880 A1    Jan. 12, 2012

(30) Foreign Application Priority Data

Jul. 8, 2010    (JP) .................................. 2010-156195

(51) Int. Cl.
*B23P 19/00*    (2006.01)

(52) U.S. Cl.
USPC ................ 29/743; 29/740; 29/742; 29/720; 700/121

(58) Field of Classification Search
USPC .......... 29/743, 740–742, 705–709, 719–722, 29/832–834; 700/121, 213
See application file for complete search history.

(56) References Cited

U.S. PATENT DOCUMENTS

| | | | | |
|---|---|---|---|---|
| 7,159,305 B2 * | 1/2007 | Aoki et al. | ....................... | 29/720 |
| 7,353,594 B2 * | 4/2008 | Yoshida et al. | .................. | 29/833 |
| 7,533,459 B2 * | 5/2009 | Kano et al. | ....................... | 29/832 |
| 7,797,819 B2 * | 9/2010 | Kawasumi et al. | ............. | 29/740 |
| 7,854,061 B2 * | 12/2010 | Kimura | ........................... | 29/739 |
| 2002/0056188 A1 * | 5/2002 | Yamaguchi | ...................... | 29/743 |

FOREIGN PATENT DOCUMENTS

JP    2009-141120    6/2009

* cited by examiner

*Primary Examiner* — Minh Trinh
(74) *Attorney, Agent, or Firm* — Dentons US LLP (57) ABSTRACT

A component mounting apparatus includes: two heads equipped with plural nozzles for suctioning and mounting a component; a memory holding at least one of information on maximum speed and maximum acceleration; an operation determining unit determining whether an operation after a suctioning operation of any one of heads is a suctioning operation or not; a speed/acceleration calculating unit calculating at least one of speed and acceleration at the time of axial movement by using at least one of the maximum speed and the maximum acceleration for the suction, if it is determined that the operation after the suctioning operation is the suctioning operation; a control signal generating unit generating a control signal; and a driving unit performing movement from the suction operation to a component suction position of the subsequent nozzle in accordance with the control signal when the suctioning operation by the subsequent nozzle is performed.

6 Claims, 6 Drawing Sheets

COMPONENT MOUNTING APPARATUS

BACKGROUND

The present disclosure relates to a component mounting apparatus, a component mounting method, and a substrate manufacturing method, which control operation of a transfer head having a plurality of nozzles to mount components on an electronic circuit substrate (hereinafter, referred to as a "substrate").

In a component mounting apparatus equipped with a rotary-type transfer head (hereinafter, referred to as a "transfer head"), a plurality of transfer heads carry out cooperative operation which carries out suctioning operation and mounting operation exclusively with respect to each other, to mount components on an arriving substrate.

Figure 1:
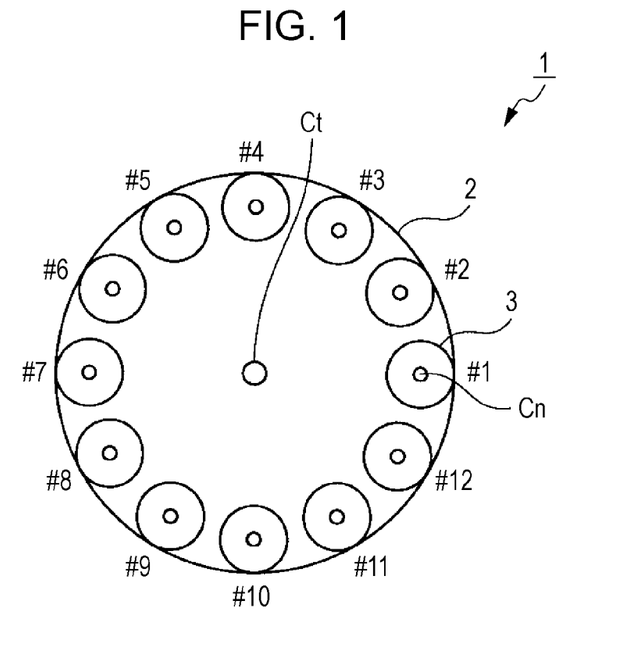
FIG. 1 is an explanatory view illustrating one example of a rotary-type transfer head.
Figure 2:
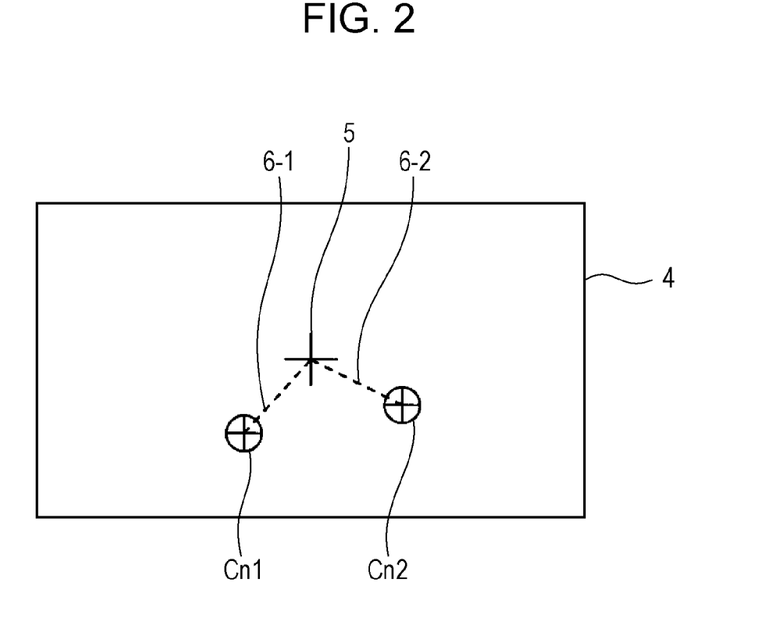
FIG. 2 is an explanatory view illustrating correction for a variation of a rotation center position of a nozzle.

As shown in FIG. 1, a transfer head 1 is equipped with a plurality of nozzles 3 (hereinafter, referred to as a "nozzle index") for suctioning components. In the plurality of nozzles 3, rotation center positions Cn1 and Cn2 of each nozzle have a variation corresponding to a component suction position 5 of a component 4 for every nozzle index, as shown in FIG. 2, due to factors such as eccentricity of a rotation center position Ct of a turret 2 or an assembly error of a shaft of a nozzle attaching portion. For this reason, correction values (correction amounts 6-1 and 6-2) for the variation of the rotation center positions Cn1 and Cn2 of these nozzle indexes are calculated at the time of calibration of the component mounting apparatus in advance. The component mounting apparatus maintains these correction values as machine data.

In the component mounting apparatus equipped with the rotary-type transfer head, in the case where the same kinds of components exist in plural in one path, since the moving distance of an axis X-Y is reduced as much as possible so as to shorten an absorbed tact, an absorbing sequence of model data is generally set to continuously carry out component absorption in the same supply unit (feeder). Herein, one path represents a unit indicating the suction and mounting operation which is carried out by one transfer head. Steps corresponding to the maximum number of nozzle indexes are present in the one path.

In the continuous suctioning operation, in order to correct the variation of the respective rotation center position Cn in the plurality of nozzles which are mounted on the transfer head 1, suction position correction of an X-Y axial direction is performed by using a correction value (machine data) for every nozzle index described above. Accordingly, even in the continuous suctioning operation, a movement operation, albeit small, is carried out in the axis X-Y so as to correct the variation of the rotation center position Cn in the respective nozzle indexes.

In addition, in the case where different kinds of components are mixed in one path, since the moving distance of the axis X-Y is reduced as much as possible so as to shorten the absorbed tact, the model data is generally set to arrange the components on the adjacent supply unit. In this instance, even though the moving distance of the transfer head 1 is extended as compared with the continuous suction, the movement operation of the axis X-Y is carried out within the relatively short moving distance which is calculated from the distance between the correction value (machine data) for every nozzle index described above and the supply unit.

Figure 3:
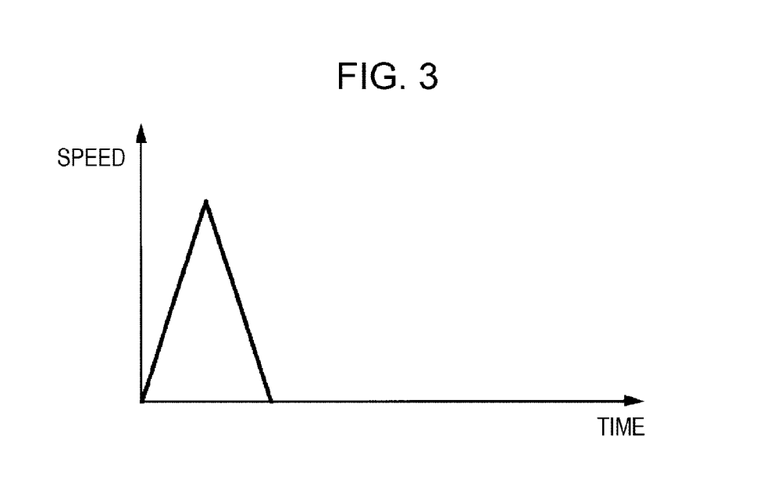
FIG. 3 is a graph illustrating a speed change of a rotary-type transfer head in the related art.

In the related art, the maximum speed and the maximum acceleration controlling a servo motor for every shaft in the operation of the respective shafts are common regardless of the operation sequence of the component mounting apparatus. FIG. 3 shows one example of the speed change when the transfer head is moved. In this operation method, the axial movement operation is carried out by using the same maximum speed and maximum acceleration as the operation sequence. In this way, in the above-described continuous suctioning operation, by which the moving distance of the axis X-Y is short, or the suctioning operation from the adjacent supply unit, deceleration is performed before the transfer head reaches the maximum speed. Accordingly, the change in acceleration is increased by abrupt acceleration/deceleration, so that residual vibrations are likely to occur at the positioning. Under such a circumstance, if a component of a small size is suctioned, there is a problem in that an error (non-suction or standing suction) is likely to occur in the suction of the component due to the influence of the residual vibrations. For example, in the case where the strength of the component mounting apparatus is increased so as to reduce the residual vibrations, the weight of the component mounting apparatus is increased. Therefore, there is a problem in that a bottom surface should be solidly made, conveyance of the component mounting apparatus is inconvenient, or the like.

In response to this problem, there is a technique of acquiring the operation time necessary for the mounting operation of another head unit, comparing the operation time necessary for the suctioning operation of the head unit, and determining the next suctioning operation in accordance with the compared result (refer to Japanese Unexamined Patent Application Publication No. 2009-141120 (FIG. 8 or the like)). That is, in the case where the operation time necessary for the mounting operation of another head unit is longer than the operation time, the suctioning operation by the head unit is switched from the simultaneous suction to discrete suction (sequential suction) by using the difference (standby time) between the operation time and the operation time necessary for the suctioning operation of the own head unit. In this way, the accuracy and the reliability of the suctioning operation at discrete suction are improved.

SUMMARY

However, in the technique disclosed in Japanese Unexamined Patent Application Publication No. 2009-141120, in the case where the operation time necessary for the mounting operation of other head unit is not longer than the operation time, the discrete suction (sequential suction) is not performed, but the simultaneous suction is performed. Since a common suctioning operation, in which the operation time of the head unit is short, is performed during the simultaneous suction, the movement speed is fast, and the influence of the residual vibrations at the positioning is increased.

Accordingly, it is desirable to perform suction of components at the more reliable suction position by suppressing occurrence of the residual vibration at the time of suctioning the component.

In order to solve the above-described problems, the present disclosure is able to set separately the highest speed and the maximum acceleration of axial movement (X-Y axial operation or the like) of a head which are common in the entire operation sequence in the related art. Herein, at least one of the acceleration or the speed with respect to the axial movement during the suction is set to be lower than the acceleration or the speed during the mounting.

The influence exerted on vibration of the head is regarded as the change in acceleration at the time of movement. That is, abrupt acceleration/deceleration seems to have a big effect on the vibration. The fact that the speed of the head at the time of movement is high consequentially causes a large change in the acceleration while being stopped or the like, which increases the vibration. Accordingly, during the suctioning operation, any one of the speed and the acceleration at the time of moving the head is set to be lower than that in the related art. Specifically, the present disclosure employs the configuration described below.

According to an embodiment of the present disclosure, in a component mounting apparatus, it is determined whether an operation performed after a suctioning operation of any one of two heads, which are provided in the component mounting apparatus and are equipped with a plurality of nozzles for suctioning and mounting a component to alternately mount the component on a substrate, is suctioning operation or not. Next, if it is determined that the operation performed after the suctioning operation is the suctioning operation, at least one of speed and acceleration at the time of axial movement of the one head is calculated by using at least one of the maximum speed and the maximum acceleration for the suction which are held in a memory provided in the component mounting apparatus. In addition, a control signal is generated in accordance with at least one of the calculated speed and the calculated acceleration. When the suctioning operation by the subsequent nozzle followed by the suctioning operation by one nozzle provided on one head is performed, movement of the subsequent nozzle to a component suction position is performed in accordance with the control signal.

According to another embodiment of the present disclosure, in a component mounting method, it is determined whether the next operation performed by a head, which is provided in a component mounting apparatus and is equipped with a plurality of nozzles for suctioning and mounting a component to mount the component on a substrate, is a suctioning operation. Next, if it is determined that the next operation performed by the head is not the suctioning operation, at least one of speed and acceleration at the time of axial movement of the head is calculated by using at least one of maximum speed and maximum acceleration for the mounting which are held in a memory provided in the component mounting apparatus. If it is determined that the next operation performed by the head is the suctioning operation, at least one of speed and acceleration at the time of axial movement of the head is calculated by using at least one of maximum speed and maximum acceleration for the suction which are held in the memory and are lower than those for the mounting. In addition, a control signal is generated in accordance with the calculated speed and the calculated acceleration. When the next operation by the subsequent nozzle followed by the operation by one nozzle provided on the head is performed, movement of the subsequent nozzle to a target position is performed in accordance with the control signal for the mounting and the suction.

According to still anther embodiment of the present disclosure, there is provided a component mounting apparatus including a head equipped with a plurality of nozzles, which performs a component suctioning operation of suctioning a component by each nozzle, and component mounting operation of mounting the respective components on a substrate by the head, wherein the head performs a first movement operation during the component suctioning operation, in which the head is moved to a target position in accordance with a correction value set for every nozzle, the head performs a second movement operation during the component mounting operation, in which the head is moved on the substrate to mount the respective components on a position set on the substrate. Here, at least one of maximum speed and maximum acceleration of the head in the first movement operation is lower than the maximum speed and maximum acceleration of the head in the second movement operation.

With the present disclosure, since the maximum acceleration (and/or the maximum speed) for the axial movement (first movement operation) of the nozzle of the head during the suction is set to be lower than the maximum acceleration (and/or the maximum speed) of other axial movement (second movement operation) except for the time of the suction, it is possible to suppress residual vibration from being generated at the time of suctioning the component. For this reason, it is possible to perform the suction of the component at the more stable suction position.

According to the present disclosure, it is possible to perform the suction of the component at the more reliable suction position by suppressing the residual vibration from being generated. Accordingly, the mounting accuracy of the component on the substrate is improved, thereby improving the quality of the substrate.

DETAILED DESCRIPTION OF EMBODIMENTS

Now, preferred embodiments for implementing the present disclosure will be described with reference to the accompanying drawings. The description will be conducted in the following order. In this instance, like components are designated with the same reference numerals in each drawing.

1. First Embodiment (example of the maximum speed and the maximum acceleration which are lower than those at the time of mounting operation, when two transfer heads carry out suctioning operation)

2. Second Embodiment (example of one transfer head)

1. First Embodiment

Figure 4:
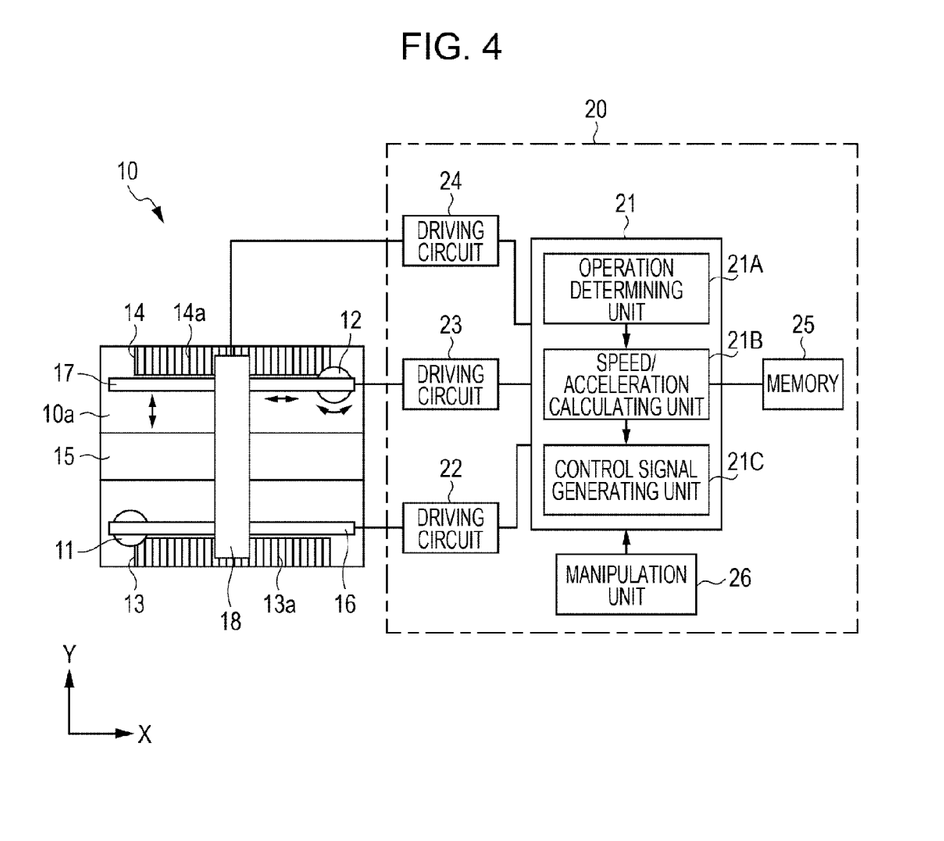
FIG. 4 is a block diagram illustrating a configuration example of a component mounting apparatus according to a first embodiment of the present disclosure.

FIG. 4 is a block diagram illustrating a configuration example of a component mounting apparatus according to a first embodiment of the present disclosure.

The component mounting apparatus includes a component mounting unit 10 and a mounting control unit 20. Components are mounted in the component mounting unit 10 under the control of the mounting control unit 20.

First, the configuration of the component mounting unit 10 will now be described.

The component mounting unit 10 includes a base 10a, a first head 11 serving as a first transfer head, a second head 12 serving as a second transfer head, a first component supply unit 13, a second component supply unit 14, a conveyer 15, a first X-axis driving unit 16, a second X-axis driving unit 17, and a Y-axis driving unit 18.

In the first heads 11 and 12, a plurality of nozzles 3 for suctioning a component (in this embodiment, nozzle indexes #1 to #12) are mounted on a turret 2, as shown in FIG. 1.

The component supply units 13 and 14 corresponding to the first head 11 and the second head 12 are separately provided. The component supply unit 13 has a plurality of feeders 13a, and a plurality of components is juxtaposed by a tape and is sequentially fed from a cassette in one feeder 13a. Similarly, the second component supply unit 14 is also provided with a plurality of feeders 14a.

The first X-axis driving unit 16 is an X-axis positioning mechanism which movably supports the first head 11, and moves the first head 11 in an X-axis direction (direction parallel with flow of the substrate) in accordance with a driving signal sent from the mounting control unit 20. In addition, the first X-axis driving unit 16 is able to rotate the first head 11 around a Z-axis direction (not shown) as a rotation center in accordance with the driving signal sent from the mounting control unit 20. The movement of the first head 11 by the second X-axis driving unit 17 may be used by, for example, a servo motor.

Similarly, the second X-axis driving unit 17 is an X-axis positioning mechanism which movably supports the second head 12, and moves the second head 12 in the X-axis direction in accordance with the driving signal sent from the mounting control unit 20. The movement of the second head 12 by the second X-axis driving unit 17 may be used by, for example, a servo motor.

A support portion of the first X-axis driving unit 16 for the first head 11 and a support portion of the second X-axis driving unit 17 for the second head 12 include a rotation mechanism (not shown) for rotating each head around the Z-axis direction as a rotation center for each head respectively. In addition, these X-axis driving units include a Z-axis driving unit (Z-axis positioning mechanism) which is not shown, but only the axial movement in the X-axis direction and the Y-axis direction will be described hereinafter.

The Y-axis driving unit 18 is a Y-axis positioning mechanism which movably supports the first X-axis driving unit 16 and the second X-axis driving unit 17, and moves the first X-axis driving unit 16 and the second X-axis driving unit 17 in the Y-axis direction (direction perpendicular to the flow of the substrate) in accordance with the driving signal sent from the mounting control unit 20. Hereinafter, the movement of the first head 11 or the second head 12 in the X-axis direction or the Y-axis direction by first X-axis driving unit 16 and the second X-axis driving unit 17 and the Y-axis driving unit 18 is referred to as an "axial operation (alternatively, axial movement). The axial operation includes the positioning of the first head 11 or the second head 12.

With the above-described configuration, the first head 11 and the second head 12 are movable in a direction parallel with or perpendicular to the plane of the base 10a. Under the control of the mounting control unit 20, while the first head 11 and the second head 12 carry out the collaboration operation to exclusively execute the suctioning operation and the mounting operation mutually, the first head 11 and the second head 12 mount the components on the substrate moving along the conveyer 15 of the base 10a.

Next, the configuration of the mounting control unit 20 will be described.

The mounting control unit 20 includes a control unit 21, driving circuits 22 and 23, a memory 25, and a manipulation unit 26. A computer such as a personal computer is used as the mounting control unit 20, and an operation processing device such as an MPU (micro processor unit) is used in the control unit 21. A non-volatile semiconductor memory, such as a flash memory, or the like is used in the memory 25, and is stored with computer programs used at component mounting processing, or various set values. The manipulation unit 26 includes a touch panel or manipulation keys, and generates an input signal in accordance with manipulation of a user to send it to the control unit 21.

The control unit 21 has functions serving as an operation determining unit 21A, a speed/acceleration calculating unit 21B, and a control signal generating unit 21C. The memory 25 is recorded with an operation sequence to execute the component mounting, set values associated with the speed/acceleration of the axial movement, or the like. The control unit 21 reads and executes a computer program input with the operation sequence to execute the component mounting from the memory 25, thereby performing the axial movement control.

The operation determining unit 21A is one example of the operation determining unit, and determines whether the operation of the head which is to be controlled at next stage, of the first head 11 and the second head 12 is the suctioning operation or other operation except for the suctioning operation. Hereinafter, the suctioning operation is targeted for, in particular, the operation of continuous suction in which the suction is followed by the suction.

Figure 5A:
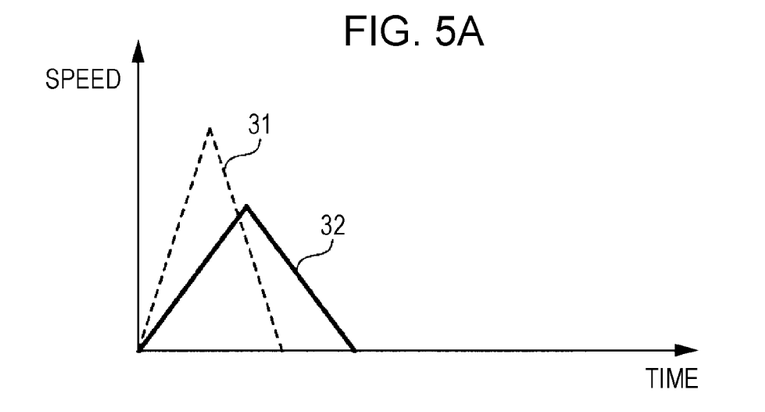
FIGS. 5A to 5C are graphs illustrating first to third examples of a speed (acceleration) change of a first head and a second head according to a first embodiment of the present disclosure, respectively.
Figure 5B:
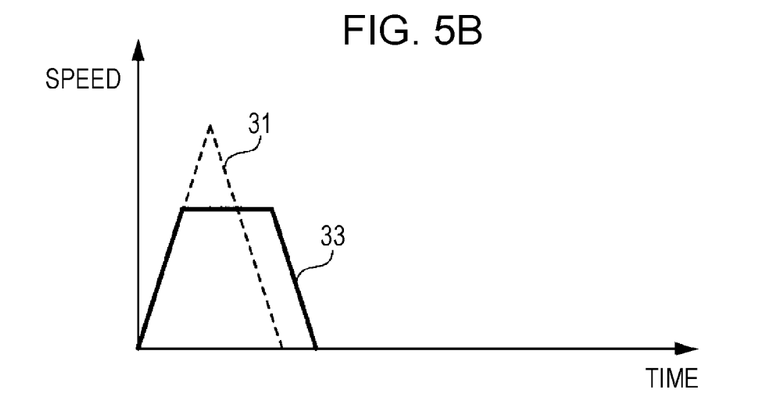
Figure 5C:
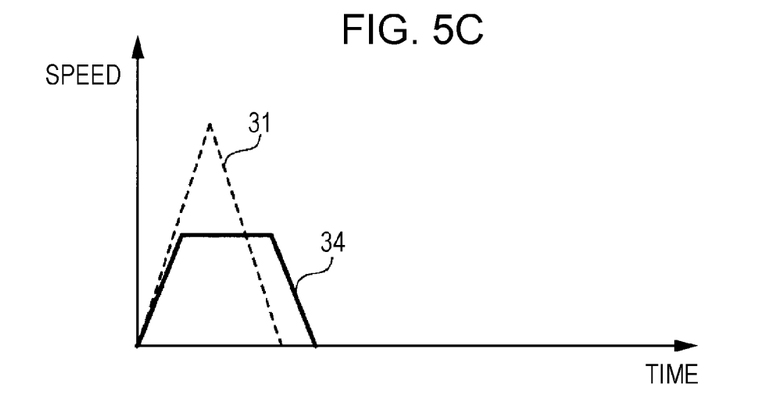

The speed/acceleration calculating unit 21B is one example of a speed/acceleration calculating unit, and determines the speed or acceleration of the first head 11 or the second head 12 at the time of movement thereof in accordance with the determined result of the operation determining unit 21A. In the present disclosure, it is possible to separately set at least one of the maximum speed and the maximum acceleration of the X-Y axis operation, which is common in the entire operation sequence in the related art, at the time of the suction and the mounting. Each of the set values for the maximum speed and the maximum acceleration is maintained in the memory 25 as machine data in advance. In this instance, the maximum speed (or the maximum acceleration) for the X-Y axis operation at the time of suctioning the components is set to be lower than the maximum speed (or the maximum acceleration) at the time of mounting the components. FIGS. 5A to 5C show examples of a speed (acceleration) change of the first head 11 and the second head 12, respectively.

First Example of Speed (Acceleration) Change

FIG. 5A is a graph illustrating an example of a case where the maximum acceleration of the first head 11 and the second head 12 at the time of suctioning the components is set to be lower than that at the time of mounting the components.

As shown in FIG. 5A, for a speed change line 32 (solid line) during the suction, an ascent and a descent have a gentle slope, respectively, as compared with a speed change line 31 (dotted line) during the mounting, and the maximum speed is also slow. In this instance, the speed change near the maximum speed is slightly low as compared with that during the mounting, but the acceleration immediately after the start of the axial movement, immediately before the stop of the axial movement, and at the change point of the speed is much lower than that during the mounting (the maximum acceleration is low). Accordingly, in particular, immediately after the start of the axial movement, immediately before the stop of the axial movement, and the change point of the speed, the abrupt acceleration/deceleration is suppressed, and thus reliable axial movement is able to be realized.

Second Example of Speed (Acceleration) Change

FIG. 5B is a graph illustrating an example of a case where the maximum speed of the first head 11 and the second head 12 at the time of suctioning the components is set to be lower than that at the time of mounting the components.

As shown in FIG. 5B, for a speed change line 33 (solid line) during the suction, an ascent and a descent have the same slope as compared with the speed change line 31 (dotted line) during the mounting, and the maximum speed is constant at a low value. In this instance, the acceleration immediately after the start of the axial movement and immediately before the stop of the axial movement is identical to that during the mounting, but since the maximum speed is constant at the low value, the abrupt acceleration/deceleration near the maximum speed is suppressed, which is able to achieve the reliable axial movement.

Third Example of Speed (Acceleration) Change

FIG. 5C is a graph illustrating an example of a case where the maximum speed and the maximum acceleration of the first head 11 and the second head 12 at the time of suctioning the components are set to be lower than that at the time of mounting the components.

As shown in FIG. 5C, for a speed change line 34 (solid line) during the suction, an ascent and a descent have a gentle slope as compared with the speed change line 31 (dotted line) during the mounting, and the maximum speed is constant at a low value. In this instance, the acceleration immediately after the start of the axial movement and immediately before the stop of the axial movement is lower than that during the mounting (the maximum acceleration is low). In addition, since the maximum speed is constant at the low value, the abrupt acceleration/deceleration is suppressed, and thus a very reliable axial movement is able to be realized.

By setting the speed/acceleration in the axial movement of the first head 11 and the second head 12 at the time of suctioning the components, the abrupt acceleration/deceleration caused by the X-Y axial movement of the first head 11 and the second head 12 during the suction is prevented, and thus a generation of residual vibration is able to be suppressed. In this instance, as described above, if the maximum acceleration at the time of suctioning the components is set to be lower than the maximum acceleration at the time of mounting the components, the maximum acceleration at the time of mounting the components may be not constant (the speed change line is straight), and may be changed, such as ascent (the speed change line is a curve). Even in this case, it is desirable that the acceleration immediately after the start of the axial movement, immediately before the stop of the axial movement, and at the change point from the acceleration to the deceleration is lower than that of other regions. The change in acceleration has an effect on the vibration, and the abrupt acceleration/deceleration has an effect on the vibration. The fact that the maximum speed is high generates the high acceleration while being stopped, which causes the vibration to increase as a result. Accordingly, in the present disclosure, at least one of the maximum speed and the maximum acceleration during the suction is lower than that during the mounting.

The speed and acceleration of the first head 11 and the second head 12, which are actually used, in the X-Y axial movement is calculated by Equations 1 and 2 below using the maximum speed and the maximum acceleration (machine data) and an override value which is set for every component, before the axial operation. In the component mounting apparatus according to the embodiment, it is stored in the memory 25 or the like on the basis of the manipulation of the manipulation unit 26 or the condition at the time of mounting the component, the maximum speed or the maximum acceleration, which is set in advance, may be multiplied by a magnification to correct the speed value or the acceleration value at the actual movement. At that time, the magnification is referred to as an override value.

$$\text{Speed} = \text{maximum speed} \times \text{override value} \quad (1)$$

$$\text{Acceleration} = \text{maximum acceleration} \times (\text{override value})^2 \quad (2)$$

In the description below, the speed/acceleration for the mounting is speed/acceleration which is calculated by applying the maximum speed/maximum acceleration for the mounting to the maximum speed and the maximum acceleration of Equations 1 and 2 described above. In addition, the speed/acceleration for the suction is speed/acceleration which is calculated by applying the maximum speed/maximum acceleration for the suction to the maximum speed and the maximum acceleration of Equations 1 and 2 described above. In this instance, as the condition for determining the override value, for example, there is a size of the component. When the component is small, it is desirable that the override value is set to be small so as to suppress the residual vibration, and the speed/acceleration is set to be low.

In this embodiment, in the case where the number of the components in the path is equal in the first head 11 and the second head 12 and the entirety of the plurality of components in one path is continuously suctioned, since a moving distance of each head is short, the time necessary for the suction is generally shorter than that of the mounting. For this reason, the standby time is occurred in the head at the suction side until the opposite head is completely mounted. Accordingly, if the maximum speed/maximum acceleration during the suction is set to be lowered within the standby time, it is possible to stabilize suction accuracy, without leading to tack delay.

Returning to the description of the control unit 21 in FIG. 4, the control signal generating unit 21C is one example of a control signal generating unit, and generates a control signal on the basis of at least one of the speed and the acceleration set by the speed/acceleration calculating unit 21B to supply it to a driving circuit corresponding to the head to be controlled.

The driving circuits 22 and 23 are, for example, a servo lamp of a servo mechanism, or a block for generating a driving signal to drive a load in accordance with the control signal sent from the control signal generating unit 21C to supply it to the first X-axis driving unit 16 or the second X-axis driving unit 17. In addition, the driving circuit 24 is also, for example, a servo lamp of a servo mechanism similarly, or a block for generating a driving signal in accordance with the control signal sent from the control signal generating unit 21C to supply it to the Y-axis driving unit 18.

The first X-axis driving unit 16, the second X-axis driving unit 17, and the Y-axis driving unit 18 are each one example of each driving unit, and generate a driving force in accordance with the driving signal to move the first head 11 and the second head 12. In this instance, the control signal generating unit 21C generates a control signal for rotating the first head 11 and the second head 12 around the Z-axis direction as a rotation center, and a control signal for moving the first head and the second head in the Z-axis direction.

In this instance, in the component mounting apparatus shown in FIG. 4, the description of the circuit portion for detecting a state of the first head 11 and the second head 12 to feed back it to the control unit 21 is omitted.

In addition, in order to reduce an influence rate for suction tact, it is desirable that the component mounting apparatus according to the present disclosure is operated under the conditions below.

(1) In the first head 11 and the second head 12, the number of the components in one path is divided equally in both heads.

(2) For kinds of components in one path, the same kinds of components are collected and arranged at one place to perform the continuous suction.

(3) In the case where different kinds of components are handled in one path, the components are arranged so that a supply unit (feeder) for the components continuously suctioned is adjacent to those.

Example of Mounting Operation

Figure 6:
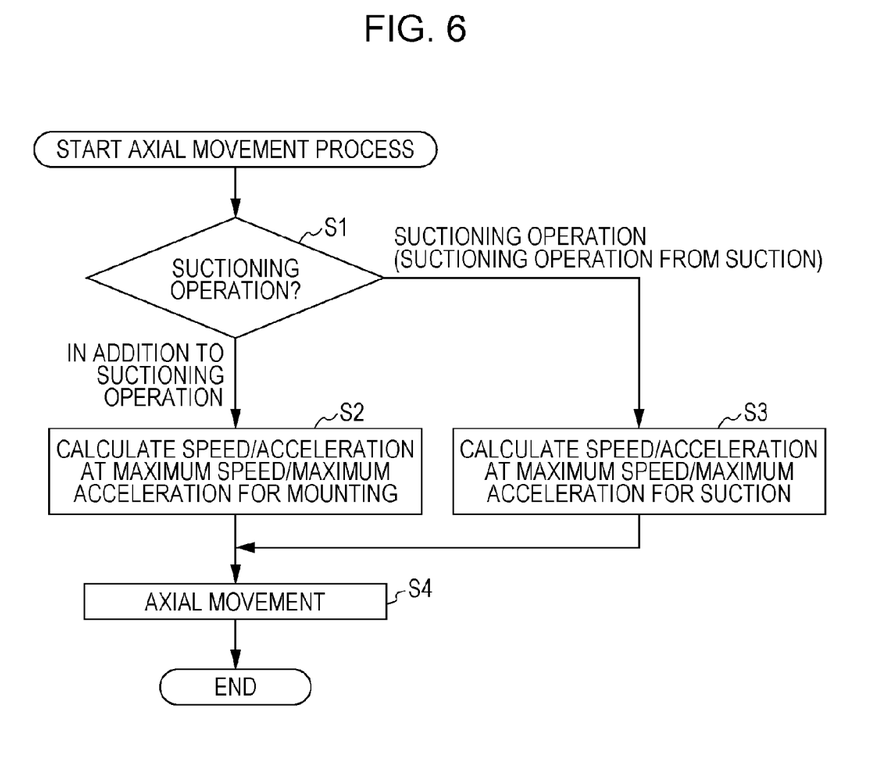
FIG. 6 is a flowchart illustrating a process at the time of axial movement (first head and second head) of a component mounting apparatus according to a first embodiment of the present disclosure.

Next, the process of axially moving the first head 11 and the second head 12 of the component mounting apparatus will be described with reference to the flowchart shown in FIG. 6.

First, the control unit 21 of the mounting control unit 20 (refer to FIG. 4) reads the computer program from the memory 25 to execute the operation sequence to mount the components. In this instance, the operation determining unit 21A of the control unit 21 determines whether the operation of the head, which is to be controlled at the next stage, of the first head 11 and the second head 12 is the suctioning operation or another operation (step S1).

In the determining process of the step S1, if it is determined that it is an operation other than the suctioning operation, the speed/acceleration calculating unit 21B calculates the speed/acceleration at the time of axial movement of the corresponding head by applying the maximum speed/maximum acceleration for the mounting to Equations 1 and 2 described above (step S2). The calculated speed/acceleration is sent to the control signal generating unit 21C.

Next, the control signal generating unit 21C generates the control signal in accordance with the previously set speed change (for example, refer to FIGS. 5A to 5C) by using the calculated speed/acceleration to appropriately send it to the driving circuits 22 to 24. The driving signal from the driving circuits 22 to 24 in accordance with the control signal is appropriately supplied to the first X-axis driving unit 16, the second X-axis driving unit 17, and the Y-axis driving unit 18 (and the Z-axis driving unit) to perform the axial movement of the corresponding head to the target position (step S4).

Meanwhile, in the determining process of the step S1, if it is determined that it is the suctioning operation (in particular, the suctioning operation from the suction), the speed/acceleration calculating unit 21B calculates the speed/acceleration at the time of axial movement of the corresponding head by applying the maximum speed/maximum acceleration for the suction to Equations 1 and 2 described above (step S3). The calculated speed/acceleration is sent to the control signal generating unit 21C, and it proceeds to step S4 to perform the axial movement of the corresponding nozzle mounted on the corresponding head to the component suction position.

After the axial movement in step S4 is completed, the process is completed. The processes of steps S1 to S4 are executed until one path is completed, and are continuously executed in the case where there is operation such as suction/mounting after the second path. In this instance, after the axial movement is completed, if the component suction or the component mounting is performed, the position correction for the component suction position or the component mounting position is performed in accordance with the correction value set for every nozzle.

Next, the example of the mounting operation applied with the axially moving process shown in FIG. 6 will be described with reference to FIGS. 7A to 8D.

FIGS. 7A to 7D are explanatory views illustrating the mounting operation of the first head 11 and the second head 12, respectively. FIGS. 8A to 8D are explanatory views illustrating the mounting operation of the first head 11 and the second head 12 which is followed by FIGS. 7A to 7D, respectively.

(1) First, at the time of starting to manufacture the substrate, in conjunction with carry-in of the substrate 30 from an upstream device, the first head 11 and the second head 12 are moved to the component suction position of the first component supply unit 13 and the second component supply unit 14 at the speed/acceleration for the mounting under the control of the mounting control unit 20 to perform the component suctioning operation. In this instance, the control unit 21 of the mounting control unit 20 controls so that the X-Y axial movement from the component suction (component suction position) by one nozzle index to the component suction (component suction position) by the subsequent nozzle index after the initial component suction is operated by using the speed/acceleration for the suction. After the component suction for one path is completed, the first head 11 and the second head 12 are moved to the standby position at the speed/acceleration for the mounting under the control of the mounting control unit 20 (refer to FIG. 7A).

Figure 7A:
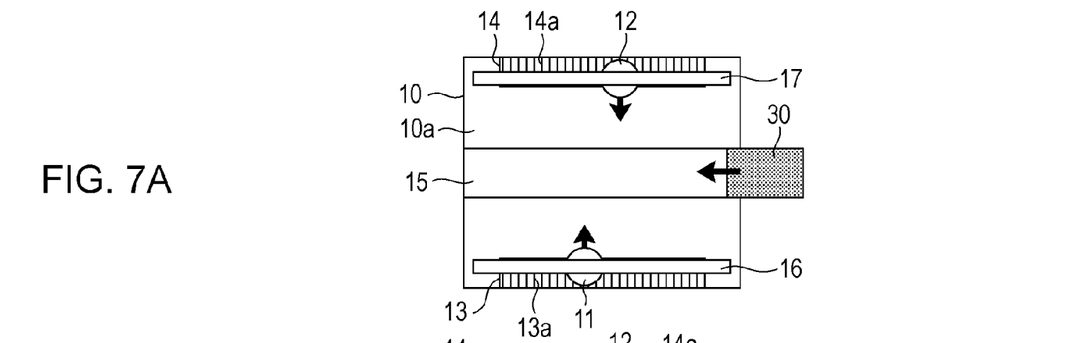
FIGS. 7A to 7D are explanatory views illustrating mounting operation of a first head and a second head, respectively.
Figure 7B:
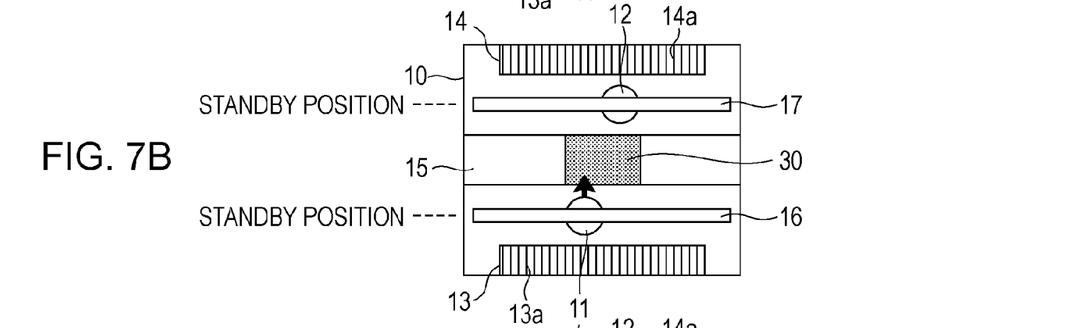
Figure 7C:
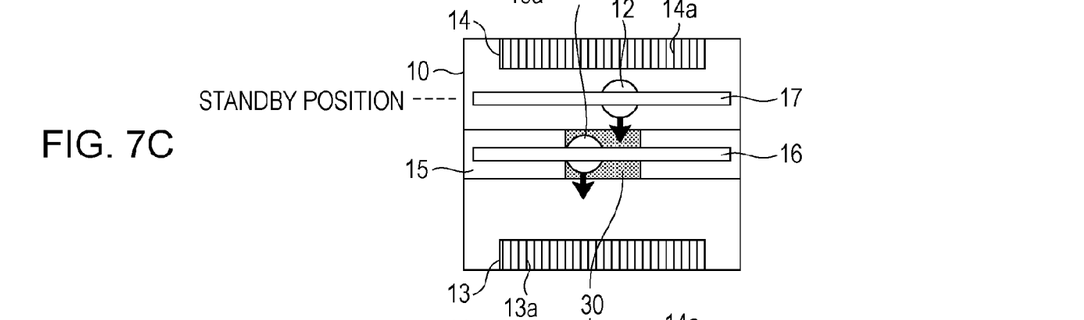

(2) If the substrate 30 is positioned at the mounting position, the first head 11 is moved to an alignment mark recognition position (not shown) at the speed/acceleration for the mounting under the control of the mounting control unit 20 to perform the alignment mark recognition (refer to FIG. 7B). By performing position alignment by recognizing the alignment mark disposed on the substrate 30 through image processing, it is possible to mount the component at the designed position of the substrate 30.

After the alignment mark recognition is completed, the first head 11 is moved to the standby position at the speed/acceleration for the mounting under the control of the mounting control unit 20. If the first head 11 is moved to the standby position, the second head 12 is moved to the alignment mark recognition position at the speed/acceleration for the mounting under the control of the mounting control unit 20 to perform the alignment mark recognition (refer to FIG. 7C). After the alignment mark recognition is completed, the second head 12 is moved to the standby position at the speed/acceleration for the mounting.

Figure 7D:
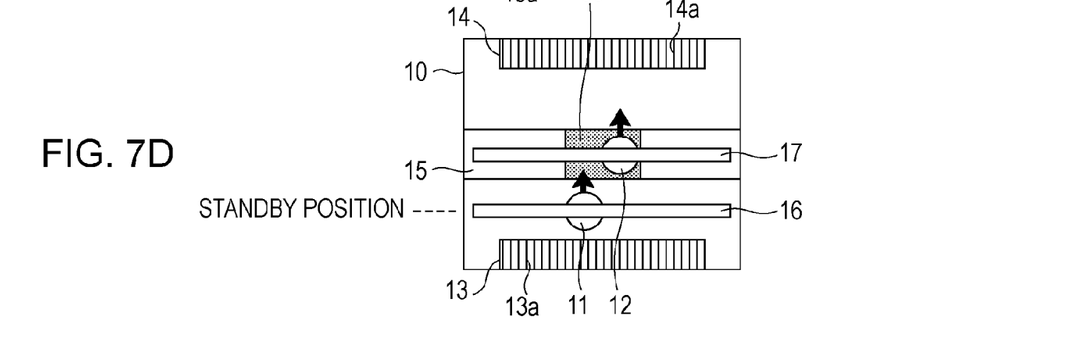
Figure 8A:
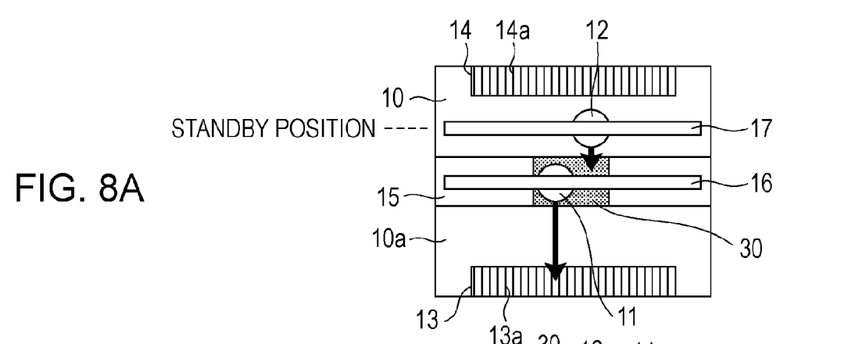
FIGS. 8A to 8D are explanatory views illustrating a mounting operation of a first head and a second head, respectively.
Figure 8B:
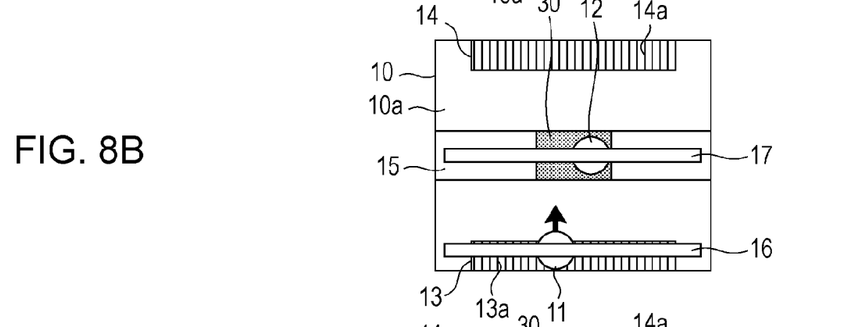
Figure 8C:
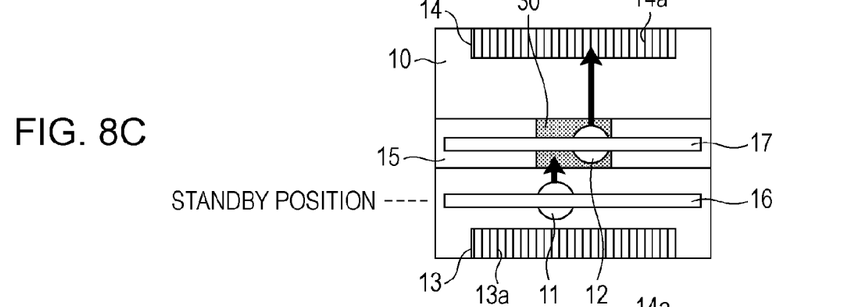
Figure 8D:
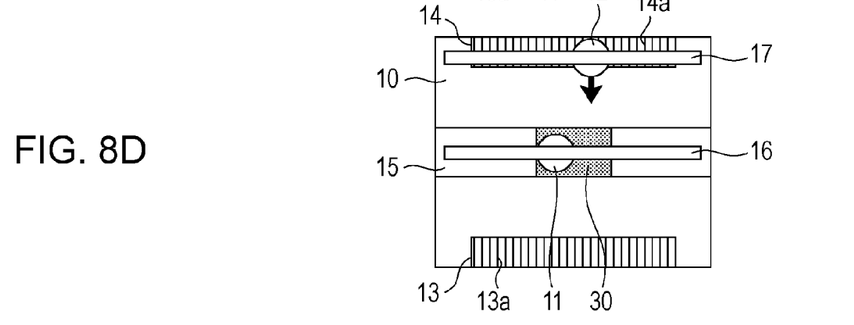

(3) If the second head 12 is moved to the standby position, the first head 11 is moved to the component mounting position at the speed/acceleration for the mounting under the control of the mounting control unit 20 to carry out the component mounting operation (refer to FIG. 7D). The X-Y axial movement during the component mounting is operated by using the speed/acceleration for the mounting.

(4) After the component mounting for one path is completed, the first head 11 is moved to the component suction position of the first component supply unit 13 at the speed/acceleration for the mounting under the control of the mounting control unit 20 so as to perform the component suction for the next path. If the first head 11 is moved to the component suction position, the second head 12 is moved to the component mounting position at the speed/acceleration for the mounting under the control of the mounting control unit 20 to perform the component mounting operation (refer to FIG. 8A). The X-Y axial movement during the component mounting is operated by using the speed/acceleration for the mounting.

(5) While the second head 12 mounts the component, the first head 11 performs the component suctioning operation at the component mounting position under the control of the mounting control unit 20. In this instance, the control unit 21 of the mounting control unit 20 controls so that the X-Y axial movement from the component suction (component suction position) by one nozzle index to the component suction (component suction position) by the subsequent nozzle index after the initial component suction is operated by using the speed/acceleration for the suction. After the component suction for one path is completed, the first head 11 is moved to the standby position at the speed/acceleration for the mounting under the control of the mounting control unit 20 (refer to FIG. 8B).

(6) After the component mounting for one path is completed, the second head 12 is moved to the component suction position of the second component supply unit 14 at the speed/acceleration for the mounting under the control of the mounting control unit 20 so as to perform the component suction for the next path. If the second head 12 is moved to the component suction position, the first head 11 is moved to the component mounting position at the speed/acceleration for the mounting under the control of the mounting control unit 20 to perform the component mounting operation (refer to FIG. 8C). The X-Y axial movement during the component mounting is operated by using the speed/acceleration for the mounting.

(7) While the first head 11 mounts the component, the second head 12 performs the component suctioning operation at the component suction position under the control of the mounting control unit 20. In this instance, the control unit 21 of the mounting control unit 20 controls so that the X-Y axial movement from the component suction by one nozzle index to the component suction by the subsequent nozzle index after the initial component suction is operated by using the speed/acceleration for the suction. After the component suction for one path is completed, the second head 12 is moved to the standby position at the speed/acceleration for the mounting under the control of the mounting control unit 20 (refer to FIG. 8D).

After that, the operation of (4) to (7) described above is repeated until entire the component mounting for the substrate 30 is completed.

Effect of First Embodiment

In the above-described embodiment, since the maximum acceleration (alternatively, the maximum speed) for the X-Y axial movement during the suction is set to be lower than the maximum acceleration (alternatively, the maximum speed) during the mounting, it is possible to suppress the residual vibration from being generated at the time of suctioning the component. For this reason, it is possible to perform the suction of the component at the more reliable suction position, thereby improving the suction rate of the small size component. Accordingly, the mounting accuracy of the component on the substrate is improved, thereby improving the quality of the substrate.

In addition, if the maximum speed/maximum acceleration during the suction is set to a low value within the range of the standby time corresponding to the difference between the mounting time and the suction time, it is possible to stabilize the suction accuracy, without leading to the tact delay.

Moreover, as shown in FIG. 4, in the case where the first head 11 and the second head 12 are supported by the common Y-axis driving unit 18, it is possible to suppress the vibration of the suction-side head when the opposite head is mounting the component, thereby suppressing spread of the vibration to the mounting-side head. For this reason, it is possible to perform the component mounting at the more stable mounting position, thereby improving the mounting accuracy.

In this instance, in the above-described embodiment, although the component mounting apparatus including two transfer heads, such as the first head 11 and the second head 12, is described, the present disclosure is able to be applied to a component mounting apparatus including three or more transfer heads. In the case where there are three or more transfer heads, it is necessary to control the plurality of transfer heads so as not to occur the state in which the operation of the transfer heads is competitive (the components are simultaneously mounted on the substrate, or the like). In addition, the present disclosure may be applied to the case where the component mounting apparatus includes one transfer head. The operation of the component mounting apparatus including one transfer head will now be described in outline.

2. Second Embodiment

In the case where the transfer head of the component mounting apparatus is one, the suctioning operation and the mounting operation are converted by using one transfer head to mount the component on the substrate. The axial movement process when there is one transfer head is performed by applying the process when two transfer heads are axially moved, which is shown in the flowchart of FIG. 6. That is, when there is one transfer head, the operation determining unit 21A of the control unit 21 (refer to FIG. 2) determines whether the operation of one transfer head to be controlled at the next stage is the suctioning operation or other operation except for the suctioning operation (step S1). Next, the speed/acceleration calculating unit 21B calculates the speed/acceleration of the transfer head at the axial movement on the basis of the determined result (steps S2 and S3). The control signal generating unit 21C generates the control signal in accordance with the calculated speed/acceleration to appropriately send it to the driving circuits 22 to 24. The driving unit for each axis is operated on the basis of the driving signal in accordance with the control signal output from the driving circuits 22 to 24, so that the axial movement of the transfer head to the target position is performed (step S4).

The process of steps S1 to S4 is executed until one path is completed, and is continuously executed in the case where there is an operation such as suction or mounting after the second path. In this instance, in the case where the component suction or the component mounting is performed after the axial movement is completed, the position correction for the component suction position or the component mounting position is performed in accordance with the correction value set for every nozzle.

In the case where there is one transfer head, since at least one of the speed and the acceleration of the transfer head in the axial movement during the suction is set to be lower than at least one of the speed and the acceleration during the mounting, it is possible to improve the mounting accuracy.

In this instance, although the component mounting apparatus equipped with the rotary-type transfer head is described in each embodiment described above, it is not limited thereto. The present disclosure is able to be applied to a component mounting apparatus equipped with an inline-type head in which a plurality of feeders is able to simultaneously suction the arranged components.

In addition, a series of processes are able to be executed by a hardware in each embodiment described above, but may be executed by a software. In the case where a series of processes are executed by the software, the processes are able to be executed by a computer including a dedicated hardware embedded with a program configuring the software, or a computer installed with a program for executing various functions. For example, the process may be executed by a general-purpose personal computer or the like installed with a program configuring the desired software.

Further, a recording medium on which a program code of the software that implements the functions of any of the embodiments described above is recorded may be supplied to a system or an apparatus. Furthermore, it will be obvious that the computer (alternatively, a control device such as CPU) of the system or apparatus may read and execute the program code stored in the recording medium to implement the function.

In this instance, the recording medium for supplying the program code may use, for example, a floppy disc, a hard disc, an optical disc, a magneto-optical disc, a CD-ROM, a CD-R, a magnetic tape, a non-volatile memory card, or a ROM.

It should be noted herein that the steps for describing the sequential processing include not only the processing operations which are sequentially performed in the described order, but also the processing operations which are executed concurrently or discretely (concurrent processing or object-oriented processing).

The present disclosure contains subject matter related to that disclosed in Japanese Priority Patent Application JP 2010-156195 filed in the Japan Patent Office on Jul. 8, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A component mounting apparatus comprising:
two heads equipped with a plurality of nozzles for suctioning and mounting a component to alternately mount the component on a substrate;
a memory holding at least one of information on maximum speed and maximum acceleration for mounting, and at least one of information on maximum speed and maximum acceleration for suction;
an operation determining unit which determines whether an operation performed after a suctioning operation of any one of the two heads is a suctioning operation or not;
a speed/acceleration calculating unit which calculates at least one of speed and acceleration at the time of axial movement of one head by using at least one of the maximum speed and the maximum acceleration for the suction which are held in the memory, if it is determined that the operation performed after the suctioning operation is the suctioning operation;
a control signal generating unit which generates a control signal in accordance with at least one of the calculated speed and the calculated acceleration; and
a driving unit which performs movement from the suction operation by one nozzle provided on the one head to a component suction position of the subsequent nozzle in accordance with the control signal when the suctioning operation by the subsequent nozzle is performed.

2. The component mounting apparatus according to claim 1, wherein a mounting time necessary for the mounting operation of the other head of the two heads is compared with a suction time necessary for the suctioning operation of the one head, and in the case where the suction time necessary for the suctioning operation of the one head is shorter than the mounting time, the suctioning operation of the one head is slowed within a range of a difference between the mounting time and the suction time.

3. The component mounting apparatus according to claim 2, wherein the memory stores the maximum acceleration for the mounting and the maximum acceleration for the suction, and the maximum acceleration for the suction is set to a small value as compared with the maximum acceleration for the mounting.

4. The component mounting apparatus according to claim 2, wherein the memory stores the maximum speed for the mounting and the maximum speed for the suction, and the maximum speed for the suction is set to a small value as compared with the maximum speed for the mounting.

5. The component mounting apparatus according to claim 2, wherein the memory stores the maximum speed and the maximum acceleration for the mounting and the maximum speed and the maximum acceleration for the suction, and the maximum speed and the maximum acceleration for the suction are set to a small value as compared with the maximum speed and the maximum acceleration for the mounting.

6. A component mounting apparatus comprising:
a head equipped with a plurality of nozzles for suctioning and mounting a component to mount the component on a substrate;
a memory holding at least one of information on maximum speed and maximum acceleration for mounting, and at least one of information on maximum speed and maximum acceleration for suction which are lower than those for the mounting;
an operation determining unit which determines whether the next operation performed by the head is a suctioning operation or not;
a speed/acceleration calculating unit which calculates at least one of speed and acceleration at the time of axial movement of the head by using at least one of the maximum speed and the maximum acceleration for the mounting which are held in the memory, if it is determined that the next operation performed by the head is not the suctioning operation, and calculates at least one of speed and acceleration at the time of axial movement of the head by using at least one of the maximum speed and the maximum acceleration for the suction which are held in the memory, if it is determined that the next operation performed by the head is the suctioning operation;
a control signal generating unit which generates a control signal in accordance with at least one of the calculated speed and the calculated acceleration; and
a driving unit which performs movement from the operation by one nozzle provided on the one head to a target position of the subsequent nozzle in accordance with the control signal, when the next operation by the subsequent nozzle is performed.

* * * * *